(12) United States Patent
Zhao

(10) Patent No.: US 12,230,695 B2
(45) Date of Patent: Feb. 18, 2025

(54) DISPLAY SUBSTRATE AND MANUFACTURING METHOD THEREOF, DISPLAY DEVICE

(71) Applicant: BOE Technology Group Co., Ltd., Beijing (CN)

(72) Inventor: Meng Zhao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/338,421

(22) Filed: Jun. 21, 2023

(65) Prior Publication Data

US 2023/0335624 A1    Oct. 19, 2023

Related U.S. Application Data

(63) Continuation of application No. 17/355,380, filed on Jun. 23, 2021, now Pat. No. 11,728,416.

(30) Foreign Application Priority Data

Nov. 24, 2020    (CN) .......................... 202011329036.6

(51) Int. Cl.
   *H01L 27/12*    (2006.01)
   *H01L 29/66*    (2006.01)
   *H01L 29/786*    (2006.01)

(52) U.S. Cl.
   CPC .... *H01L 29/66969* (2013.01); *H01L 27/1225* (2013.01); *H01L 27/1251* (2013.01);
   (Continued)

(58) Field of Classification Search
   CPC ............. H01L 21/77; H01L 21/022532; H01L 21/823565; H01L 21/026667;
   (Continued)

(56) References Cited

U.S. PATENT DOCUMENTS 6,534,788 B1 * 3/2003 Yeo ................... H01L 29/78648
                                                                 257/66
7,154,119 B2   12/2006 Yamazaki et al.
(Continued)

FOREIGN PATENT DOCUMENTS

CN    106684155 A    5/2017
CN    111415948 A    7/2020

OTHER PUBLICATIONS

USPTO, U.S. Appl. No. 17/355,380 First Office Action issued on Oct. 31, 2022.

(Continued)

*Primary Examiner* — Nikolay K Yushin
(74) *Attorney, Agent, or Firm* — HOUTTEMAN LAW LLC

(57) ABSTRACT

The present disclosure provides a display substrate and a manufacturing method thereof, and a display device, belongs to the field of display technology. The method includes forming a first thin film transistor, which includes: forming a first gate of the first thin film transistor on a base substrate through a patterning process; forming a first gate insulating layer on a side of the first gate distal to the base substrate; sequentially forming a first semiconductor material layer, a second gate insulating layer and a second gate metal layer on a side of the first gate insulating layer distal to the base substrate, and forming a pattern including an active layer of the first thin film transistor, a pattern of the second gate insulating layer and a second gate of the first thin film transistor through a patterning process.

18 Claims, 4 Drawing Sheets

(52) U.S. Cl.
CPC ...... *H01L 27/127* (2013.01); *H01L 29/78648* (2013.01); *H01L 29/7869* (2013.01)

(58) Field of Classification Search
CPC ......... H01L 21/823456; H01L 27/1225; H01L 27/12; H01L 27/1251; H01L 27/127; H01L 27/1259; H01L 29/78648; H01L 29/786; H01L 29/7869; H01L 29/66969; H01L 29/66; H01L 2021/775; Y02P 70/50
See application file for complete search history.

(56) References Cited

U.S. PATENT DOCUMENTS

| | | |
|---|---|---|
| 11,049,975 B2 | 6/2021 | Qu et al. |
| 11,335,709 B2 | 5/2022 | He et al. |
| 2005/0247937 A1 | 11/2005 | Yamazaki et al. |
| 2017/0256569 A1 | 9/2017 | Ohara |

OTHER PUBLICATIONS

USPTO, U.S. Appl. No. 17/355,380 Notice of Allowance issued on Mar. 22, 2023.
USPTO, U.S. Appl. No. 17/355,380 Corrected Notice of Allowance issued on Mar. 30, 2023.
USPTO, U.S. Appl. No. 17/355,380 Corrected Notice of Allowance issued on Apr. 18, 2023.
USPTO, U.S. Appl. No. 17/355,380 Corrected Notice of Allowance issued on May 1, 2023.

\* cited by examiner

DISPLAY SUBSTRATE AND MANUFACTURING METHOD THEREOF, DISPLAY DEVICE

CROSS REFERENCE TO RELATED APPLICATIONS

This is a continuation application of U.S. patent application Ser. No. 17/355,380, filed on Jun. 23, 2021, which claims the priority of the Chinese Patent Application No. 202011329036.6 filed on Nov. 24, 2020, the content of which is incorporated herein by reference in its entirety.

The present application claims the priority of the Chinese Patent Application No. 202011329036.6 filed on Nov. 24, 2020, the content of which is incorporated herein by reference in its entirety.

TECHNICAL FIELD

The present disclosure relates to the field of display technology, and in particular to a display substrate, a manufacturing method for a display substrate and a display device.

BACKGROUND

With the rapid development in the field of display devices, a Low Temperature Polycrystalline Oxide (LTPO) display panel has appeared. The existing low temperature polycrystalline oxide display panel typically includes low temperature polycrystalline silicon thin film transistors and oxide thin film transistors. A threshold voltage of the low temperature polycrystalline silicon thin film transistor is not drifted, and the low temperature polycrystalline silicon thin film transistor is used as a driving transistor; the oxide thin film transistor has good switching performance and is used as a switching transistor.

SUMMARY

The present disclosure provides a display substrate, a method for manufacturing a display substrate and a display device.

The display substrate of the embodiment of the present disclosure includes a base substrate and a first thin film transistor on the substrate; wherein a first gate of the first thin film transistor is on the base substrate, and a first gate insulating layer is on a side of the first gate of the first thin film transistor distal to the base substrate;

an active layer of the first thin film transistor is on a side of the first gate insulating layer distal to the base substrate; a second gate insulating layer is on a side of the active layer of the first thin film transistor distal to the base substrate;

a second gate of the first thin film transistor is on a side of the second gate insulating layer distal to the base substrate, and an orthographic projection of the second gate of the first thin film transistor on the base substrate is in an orthographic projection of the active layer of the first thin film transistor on the base substrate; a first interlayer insulating layer is on a side of the second gate of the first thin film transistor distal to the base substrate;

a source, a drain of the first thin film transistor and a gate line are on a side of the first interlayer insulating layer distal to the base substrate, and the source and the drain of the first thin film transistor are respectively connected to the active layer of the first thin film transistor through a source contact via and a drain contact via penetrating through the first interlayer insulating layer; the gate line is electrically connected to the second gate of the first thin film transistor through a first connection via penetrating through the first interlayer insulating layer.

In some embodiments, the gate line is electrically connected to the first gate of the first thin film transistor through a second connection via in the first interlayer insulating layer, the second gate insulating layer, and the first gate insulating layer.

In some embodiments, the display substrate further includes a second thin film transistor; and a source and a drain of the second thin film transistor are in a same layer as the source and the drain of the first thin film transistor, and are made of a same material as the source and the drain of the first thin film transistor.

In some embodiments, a material of the active layer of the first thin film transistor includes oxide semiconductor.

In some embodiments, the second thin film transistor further includes an active layer on the base substrate, a third gate insulating layer is on the active layer, a gate of the second thin film transistor is on the third insulating layer, and a second interlayer insulating layer is on the gate of the second thin film transistor; and the first gate of the first thin film transistor is on the second interlayer insulating layer.

In some embodiments, a material of the active layer of the second thin film transistor includes low temperature polycrystalline silicon.

The embodiment of the present disclosure provides a method for manufacturing a display substrate, including: a step of forming a first thin film transistor; wherein the step of forming the first thin film transistor includes steps of:

forming a first gate of the first thin film transistor on a base substrate through a patterning process;

forming a first gate insulating layer on a side of the first gate distal to the base substrate;

sequentially forming a first semiconductor material layer, a second gate insulating material layer and a second gate metal layer on a side of the first gate insulating layer distal to the base substrate, and forming a pattern including an active layer of the first thin film transistor, and a pattern comprising a second gate insulating layer and a second gate of the first thin film transistor;

forming a first interlayer insulating layer on a side of a layer, where the second gate of the first thin film transistor is located, distal to the base substrate, and forming a first source contact via, a first drain contact via and a first connection via penetrating through the first interlayer insulating layer;

forming a source and a drain of the first thin film transistor and a gate line on a side of the first interlayer insulating layer distal to the base substrate; wherein the source and the drain of the first thin film transistor are electrically connected to the active layer through the first source contact via and the first drain contact via, respectively; and the gate line is electrically connected to the second gate through the first connection via.

In some embodiments, the method further includes forming a second connection via penetrating through the first interlayer insulating layer, the second gate insulating layer, and the first gate insulating layer while forming the first source contact via, the first drain contact via, and the first connection via penetrating through the first interlayer insulating layer; and the gate line is electrically connected to the first gate through the second connection via.

In some embodiments, the step of sequentially forming a first semiconductor material layer, a second gate insulating material layer and a second gate metal layer on a side of the first gate insulating layer distal to the base substrate, and forming a pattern including an active layer of the first thin film transistor, a pattern comprising a second gate insulating layer and a second gate of the first thin film transistor includes steps of:
- sequentially depositing the first semiconductor material layer, the second gate insulating material layer and the second gate metal layer on a side of the first gate insulating layer distal to the base substrate;
- forming the pattern including the second gate insulating layer and the second gate of the first thin film transistor through a patterning process;
- coating photoresist on a side of the second gate of the first thin film transistor distal to the base substrate, and forming the pattern including the active layer of the first thin film transistor through a patterning process.

In some embodiments, the manufacturing method further includes a step of forming a second thin film transistor, wherein the step of forming a second thin film transistor includes:
- forming an active layer and a gate of the second thin film transistor on the base substrate; and
- forming a source and a drain of the second thin film transistor while forming the source and the drain of the first thin film transistor and the gate line on a side of the first interlayer insulating layer distal to the base substrate.

In some embodiments, the step of forming an active layer and a gate of the second thin film transistor on the base substrate includes:
- forming a pattern including the active layer of the second thin film transistor on the base substrate through a patterning process;
- forming a third gate insulating layer on a side of the active layer of the second thin film transistor distal to the base substrate; and
- forming a pattern including the gate of the second thin film transistor on a side of the third gate insulating layer distal to the base substrate through a patterning process.

In some embodiments, after the step of forming a pattern of the gate of the second thin film transistor on a side of the third gate insulating layer distal to the base substrate through a patterning process, the method further includes: a step of forming a second interlayer insulating layer; and the step of forming the first gate of the first thin film transistor on the base substrate through a patterning process includes: a step of forming the first gate of the first thin film transistor on a side of the second interlayer insulating layer distal to the base substrate through a patterning process.

In some embodiments, a material of the active layer of the second thin film transistor includes low temperature polycrystalline silicon.

In some embodiments, a material of the active layer of the first thin film transistor includes oxide semiconductor.

In some embodiments, the step of forming a source and a drain of the second thin film transistor while forming the source and the drain of the first thin film transistor and the gate line on a side of the first interlayer insulating layer distal to the base substrate includes steps of: forming the first interlayer insulating layer on a side of a layer where the second gate of the first thin film transistor is located distal to the base substrate, forming the first source contact via, the first drain contact via and the first connection via penetrating through the first interlayer insulating layer, and the second connection via penetrating through the first interlayer insulating layer, the second gate insulating layer and the first gate insulating layer, and forming a second source contact via and a second drain contact via penetrating through the first interlayer insulating layer, the second interlayer insulating layer, the first gate insulating layer, and the third gate insulating layer; and forming the source and the drain of the first thin film transistor, the source and the drain of the second thin film transistor and the gate line on a side of the first interlayer insulating layer distal to the base substrate through a patterning process; wherein the source and the drain of the first thin film transistor are electrically connected to the active layer of the first thin film transistor through the first source contact via and the first drain contact via, respectively; the source and the drain of the second thin film transistor are electrically connected to the active layer of the second thin film transistor through the second source contact via and the second drain contact via, respectively; the gate line is electrically connected to the second gate through the first connection via and electrically connected to the first gate through the second connection via.

The embodiment of the present disclosure also provides a display device, which includes the above display substrate.

Figure 1A:
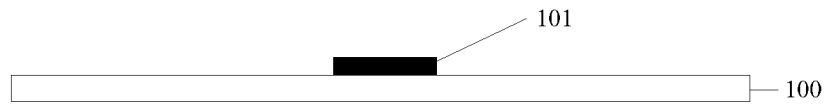
FIGS. 1(a) to 1(h) are schematic views illustrating a procedure of forming an oxide thin film transistor.

DESCRIPTION OF REFERENCE NUMERALS 1, 100—a base substrate; 6, 101—a first gate of an oxide thin film transistor; 4, 102—a first gate insulating layer of the oxide thin film transistor; 103—an oxide semiconductor layer; 104—a second gate insulating layer; 105—a second gate metal layer; 9, 106—a second gate of the oxide thin film transistor; 8, 107—a second gate insulating layer; 2—a third gate insulating layer; 108—photoresist; 7, 109—an active layer of the oxide thin film transistor; 5, 110—a first interlayer insulating layer; 3—a second interlayer insulating layer; 10, 111—a source of the oxide thin film transistor; 11, 112—a drain of the oxide thin film transistor; 12, 113—a gate line; 114—a first connection via; 115—a second connection via; 13—an active layer of a low temperature polycrystalline silicon thin film transistor; 14—a source of the low temperature polycrystalline silicon thin film transistor; 15—a drain of the low temperature polycrystalline silicon thin transistor; 16—a gate of the low temperature polycrystalline silicon thin film transistor.

DETAIL DESCRIPTION OF EMBODIMENTS

To enable a person skilled in the art to better understand technical solutions of the present disclosure, the present disclosure will be further described in detail below with reference to the accompanying drawings and exemplary embodiments.

Unless defined otherwise, technical or scientific terms used herein should have the same meaning as commonly understood by a person skilled in the art to which the present disclosure belongs. The term "first", "second", or the like used in the present disclosure are not intended to indicate any order, quantity, or importance, but rather are used for distinguishing one element from another. Also, the term "a", "an", "the", or the like does not denote a limitation of quantity, but rather denotes the presence of at least one element. The term "including", "including", or the like means that the element or item preceding the term contains the element or item listed after the term and its equivalent, but does not exclude the presence of other elements or items. The term "connected", "coupled", or the like is not limited to a physical or mechanical connection, but may include an electrical connection, whether direct or indirect connection. The term "upper", "lower", "left", "right", or the like is used only for indicating a relative positional relationship, and when the absolute position of the object being described is changed, the relative positional relationship may also be changed accordingly.

In the embodiment of the present disclosure, a "patterning process" refers to a step of forming a structure having a specific pattern, and may be a photolithography process which includes one or more steps of forming a material layer, coating a photoresist, exposing, developing, etching, and stripping the photoresist. Alternatively, the "patterning process" may also be an imprinting process, an inkjet printing process, or any other process.

In the embodiments of the present disclosure, "in a same layer" refers to a layer structure formed by: forming a layer having a specific pattern by using a same film forming process; and then performing one patterning process by using a same mask. The one patterning process may include multiple exposing, developing, or etching processes according to different specific patterns, and the formed specific patterns in a same layer may be continuous or discontinuous, and may be at different heights or have different thicknesses.

During manufacturing the LTPO display substrate in the prior art, since an active layer of the oxide thin film transistor is not sufficiently stable, the active layer of the oxide thin film transistor has problems of being contaminated by photoresist, being corroded by etching solution, and the like. Therefore, how to reduce damages to the active layer of the oxide thin film transistor in the manufacturing method becomes a technical problem to be solved in the field.

A conventional display substrate includes a plurality of pixel driving circuits each including a plurality of thin film transistors. A manufacturing method for the thin film transistor of the display substrate in the prior art includes the following steps.

Firstly, a pattern including an active layer of each thin film transistor is formed on a base substrate through a first patterning process.

Then, a gate insulating layer is formed on a side of the active layer distal to the base substrate, and a pattern including the gate insulating layer of each thin film transistor is formed through a second patterning process.

Finally, a gate metal layer is formed on a side of the gate insulating layer distal to the base substrate, and a pattern of a gate of each thin film transistor is formed through a third patterning process.

The inventor finds that in the existing manufacturing method for the thin film transistor, the active layer is firstly formed, and the gate insulating layer and the gate are then formed. In this way, the active layer of the thin film transistor is easily contaminated by photoresist and corroded by etching solution, which results in the problem that the active layer of the thin film transistor is unstable.

In view of the above problem, a first aspect of the embodiments of the present disclosure provides a method for manufacturing a display substrate. In this embodiment, one thin film transistor (i.e., a first thin film transistor) in a display substrate will be described as an example. This embodiment will be described by taking an example in which the first thin film transistor is an oxide thin film transistor, but it should be understood that the first thin film transistor in the embodiment of the present disclosure is not limited to the oxide thin film transistor, and the first thin film transistor may alternatively be an amorphous silicon thin film transistor, a low temperature polycrystalline silicon transistor, and the like, which is not limited in particular herein. In addition, this embodiment will be described by taking an example in which the oxide thin film transistor is a dual gate thin film transistor.

FIGS. 1(a) to 1(h) are schematic views illustrating a procedure for forming an oxide thin film transistor. As shown in FIGS. 1(a) to 1(h), the method for manufacturing a display substrate according to the embodiment of the present disclosure includes the following steps:

Step S1: as shown in FIG. 1(a), forming a first gate 101 of an oxide thin film transistor on a base substrate 100 through a patterning process.

In this step, the base substrate 100 is a glass substrate, a quartz substrate, an organic substrate, or the like. Specifically, a first gate metal layer may be deposited by using a sputtering method, a Plasma Enhanced Chemical Vapor Deposition (PECVD) method, a Low Pressure Chemical Vapor Deposition (LPCVD) method, an Atmospheric Pressure Chemical Vapor Deposition (APCVD) method, or an Electron Cyclotron Resonance Chemical Vapor Deposition (ECRCVD) method, and then, a pattern of the first gate 101 of the oxide thin film transistor may be formed by the patterning process. The first gate metal layer includes: a single-layer or multi-layer composite lamination formed by one or more of molybdenum (Mo), molybdenum-niobium alloy (MoNb), aluminum (Al), aluminum-neodymium alloy (AlNd), titanium (Ti) and copper (Cu), such as a single-layer or multi-layer composite film formed by Mo, Al or Mo and Al-containing alloy. The patterning process for the gate metal layer by using a mask to form the gate 101 is a conventional patterning process, and is not described herein again.

Figure 2:
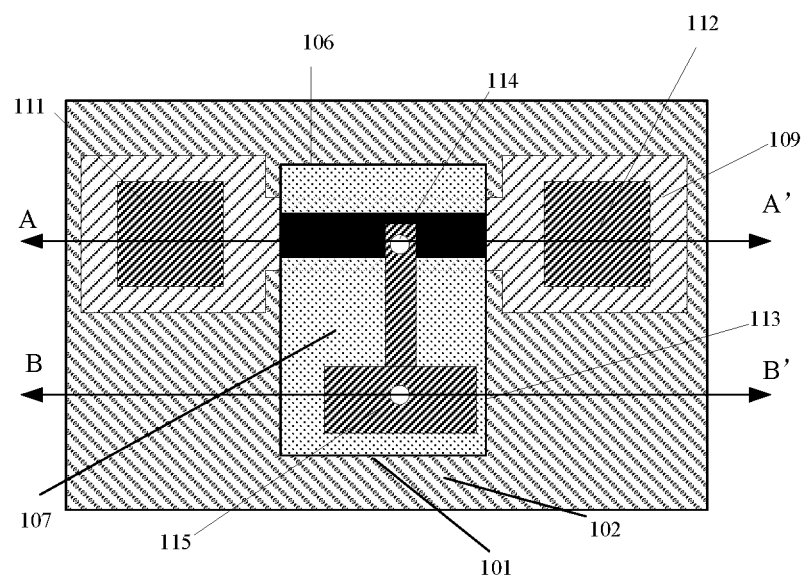
FIG. 2 is a schematic top view of an exemplary oxide thin film transistor.

As shown in FIG. 2, since the oxide thin film transistor to be formed by the present disclosure includes two gates, that is, a bottom gate and a top gate. The first gate 101 formed in step S1 is used as the bottom gate, and when the pattern of the first gate 101 is formed, its electrical connection should be considered. As shown in FIG. 2, an area of the first gate 101 formed in this step may be relatively large.

Figure 1B:
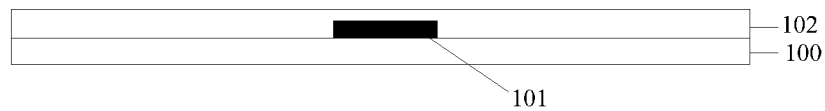

Step S2: as shown in FIG. 1(b), forming a first gate insulating layer 102 on a side of the first gate 101 distal to the base substrate 100. In this step, the first gate insulating layer 102 may be formed on the base substrate 100 subjected to the step S1 by using the Plasma Enhanced Chemical Vapor Deposition (PECVD) method, the Low Pressure Chemical Vapor Deposition (LPCVD) method, the Atmospheric Pressure Chemical Vapor Deposition (APCVD) method, the Electron Cyclotron Resonance Chemical Vapor Deposition (ECRCVD) method or the sputtering method.

The first gate insulating layer 102 is made of silicon oxide (SiOx), silicon nitride (SiNx), hafnium oxide (HfOx), silicon oxynitride (SiON), aluminum oxide (AlOx), or a multilayer film including two or three of these materials. The material of the first gate insulating layer 102 in this embodiment may be silicon oxide. As shown in FIG. 2, the first gate insulating layer 102 will completely cover the first gate 101, and the formed first gate insulating layer 102 may be flat.

Step S3: sequentially forming a first semiconductor material layer 103, a second gate insulating layer 104 and a second gate metal layer 105 on a side of the first gate insulating layer 102 distal to the base substrate 100, and forming an active layer 109 of the oxide thin film transistor, a pattern of the second gate insulating layer 107 and a pattern of a second gate 106 of the oxide thin film transistor through patterning processes. The first semiconductor material layer of the present embodiment is an oxide semiconductor layer 103.

In this step, firstly, the oxide semiconductor layer 103, the second gate insulating layer 104, and the second gate metal layer 105 are sequentially formed on the first gate insulating layer 102. The material of the oxide semiconductor layer 103 is any one of ITO (indium tin oxide), IZO (indium zinc oxide), IGZO (indium gallium zinc oxide), and InGaSnO (indium gallium tin oxide). The material of the oxide semiconductor layer 103 in this embodiment may be IGZO (indium gallium zinc oxide).

Then, a photoresist layer is coated on the second gate metal layer 105, and the photoresist layer is exposed by using a Half Tone Mask (HTM) or a Gray Tone Mask (GTM), and finally, a pattern including the second gate 106 of the oxide thin film transistor, the second gate insulating layer 107, and the active layer 109 of the oxide thin film transistor is formed through steps of developing, etching and removing photoresist.

In some embodiments, step S3 specifically includes steps of:

Step S31, sequentially depositing the oxide semiconductor layer 103, the second gate insulating layer 104, and the second gate metal layer 105 on a side of the first gate insulating layer 102 distal to the base substrate 100.

Figure 1C:
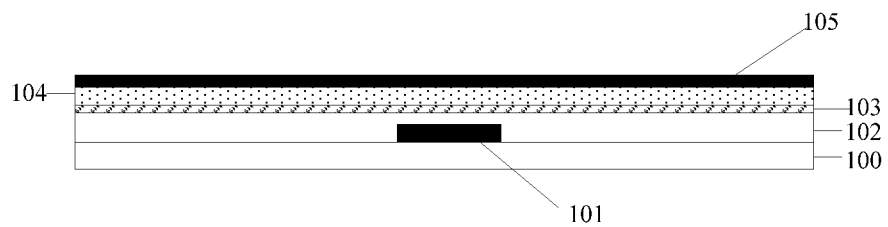

In this step, as shown in FIG. 1(c), firstly, the oxide semiconductor layer 103 is deposited on the first gate insulating layer 102 subjected to the step S2 by using the sputtering method, a thermal evaporation method, the Plasma Enhanced Chemical Vapor Deposition (PECVD) method, the Low Pressure Chemical Vapor Deposition (LPCVD) method, the Atmospheric Pressure Chemical Vapor Deposition (APCVD) method or the Electron Cyclotron Resonance Chemical Vapor Deposition (ECRCVD) method.

Then, the second gate insulating layer 104 is deposited on the formed oxide semiconductor layer 103 by using the Plasma Enhanced Chemical Vapor Deposition (PECVD) method, the Low Pressure Chemical Vapor Deposition (LPCVD) method, the Atmospheric Pressure Chemical Vapor Deposition (APCVD) method, the Electron Cyclotron Resonance Chemical Vapor Deposition (ECRCVD) method or the sputtering method.

Further, the second gate metal layer 105 is deposited on the formed second gate insulating layer 104 by using the sputtering method, the Plasma Enhanced Chemical Vapor Deposition (PECVD) method, the Low Pressure Chemical Vapor Deposition (LPCVD) method, the Atmospheric Pressure Chemical Vapor Deposition (APCVD) method or the Electron Cyclotron Resonance Chemical Vapor Deposition (ECRCVD) method.

Step S32, forming a pattern including the second gate 106 and the second gate insulating layer pattern 107 of the oxide thin film transistor through one patterning process.

Figure 1D:
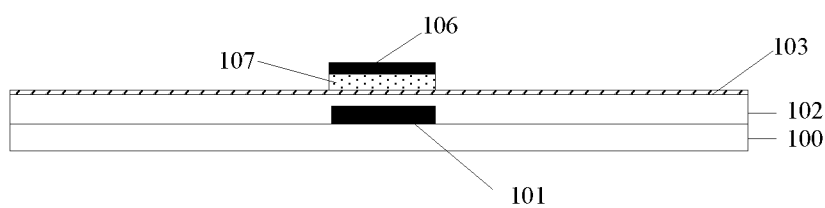

In this step, as shown in FIG. 1(d), a first photoresist is coated on the second gate metal layer 105 subjected to the step S32, and after the first photoresist is exposed and developed by using the Half Tone Mask (HTM) or the Gray Tone Mask (GTM), the second gate metal layer 105 and the second gate insulating layer 104 are sequentially etched to form a pattern including the second gate 106 and the second gate insulating layer 107 of the oxide thin film transistor.

Step S33: coating a second photoresist 108 on a side of the second gate 106 of the oxide thin film transistor distal to the base substrate, and forming a pattern including the active layer 109 of the oxide thin film transistor through one patterning process.

Figure 1E:
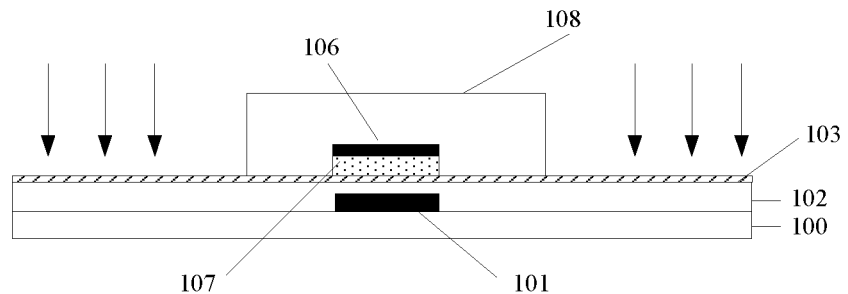
Figure 1F:
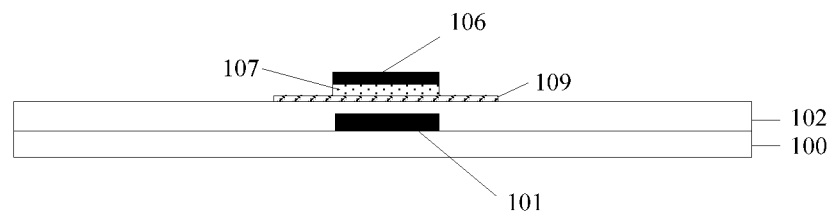

In this step, as shown in FIGS. 1(e) to 1(f), after the pattern including the second gate 106 and the second gate insulating layer pattern 107 of the oxide thin film transistor, the second photoresist 108 is coated on the side of the second gate 106 of the oxide thin film transistor distal to the base substrate 100, and a pattern including the active layer 109 of the oxide thin film transistor is formed through steps of exposing, developing, etching, and removing the photoresist. An orthographic projection of the coated second photoresist 108 on the base substrate 100 completely overlaps with an orthographic projection of a channel region of the active layer 109 of the oxide thin film transistor on the base substrate 100.

As shown in FIG. 2, an orthographic projection of the second gate 106 on the base substrate 100 falls within an orthographic projection of the pattern of the active layer 109 of the oxide thin film transistor on the base substrate 100, and the second gate insulating layer 107 will extend beyond the pattern of the second gate 106, so that the second gate insulating layer 107 and the first gate insulating layer 102 will be in contact with each other on a portion of the first electrode 101.

Step S4, forming a first interlayer insulating layer 110 on a side of a layer, where the second gate 106 of the oxide thin film transistor is located, distal to the base substrate 100, and forming a first source contact via, a first drain contact via, and a first connection via penetrating through the first interlayer insulating layer 110, and a second connection via penetrating through the first interlayer insulating layer 110, the first gate insulating layer 107, and the second gate insulating layer 102. A source 111 and a drain 112 of the oxide thin film transistor, and a gate line 113 are formed on a side of the first interlayer insulating layer 110 distal to the base substrate 100. The source 111 and the drain 112 of the oxide thin film transistor are electrically connected to the active layer 109 through the first source contact via and the first drain contact via, respectively; the gate line 113 is electrically connected to the second gate 106 through the first connection via and electrically connected to the first gate 101 through the second connection via.

Figure 1G:
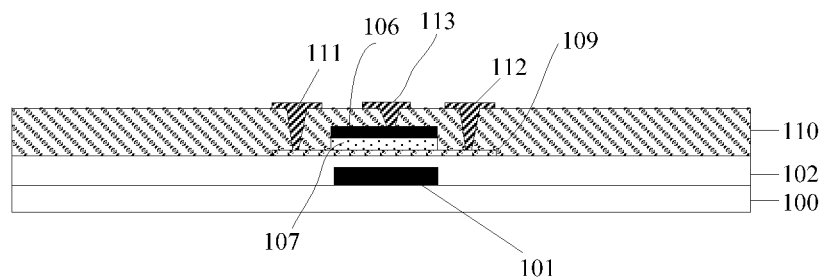
Figure 1H:
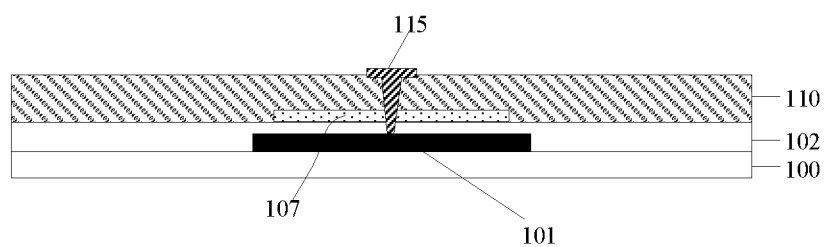

In this step, as shown in FIGS. 1(g) and 1(h) and 2, firstly, the first interlayer insulating layer 110 may be deposited by using the Plasma Enhanced Chemical Vapor Deposition (PECVD) method, the Low Pressure Chemical Vapor Deposition (LPCVD) method, the Atmospheric Pressure Chemical Vapor Deposition (APCVD) method, the Electron Cyclotron Resonance Chemical Vapor Deposition (ECRCVD) method or the sputtering method. Then, a wet etching or dry etching process may be performed on the first interlayer insulating layer 110 to form the first source contact via, the first drain contact via, and the first connection via 114 penetrating through the first interlayer insulating layer 110, and the second connection via 115 penetrating through the first interlayer insulating layer 110, the first gate insulating layer 107, and the second gate insulating layer 102. FIGS. 1(g) and 1(h) are cross-sectional views taken along lines AA 'and BB' in FIG. 2, respectively.

Then, a source drain metal thin film may be deposited by using the sputtering method, the thermal evaporation method, the Plasma Enhanced Chemical Vapor Deposition (PECVD) method, the Low Pressure Chemical Vapor Deposition (LPCVD) method, the Atmospheric Pressure Chemical Vapor Deposition (APCVD) method or the Electron Cyclotron Resonance Chemical Vapor Deposition (ECRCVD) method, and a pattern including the source 111, the drain 112 of the oxide thin film transistor and the gate line 113 may be formed by a patterning process. In this embodiment, the gate line 113 is disposed on a same layer as the source 111 and the drain 112 of the oxide thin film transistor, the source 111 and the drain 112 of the oxide thin film transistor are electrically connected to the active layer 109 through the first source contact via and the first drain contact via, respectively, and the gate line 113 is electrically connected to the second gate 106 through the first connection via 114 and is electrically connected to the first gate 101 through the second connection via 115. As shown in FIG. 2, the gate line 113 connects the first gate 101 and the second gate 106 together through the first connection via 114 and the second connection via 115.

That is, in the embodiment of the present disclosure, the second connection via 115 and the first connection via 114 respectively connecting the second gate 106 and the first gate 101 are formed through a same process, and the source 111, the drain 112, and the gate line 113 connecting the first gate 101 and the second gate 106 together are formed through a same process.

In FIGS. 1 (g) and 1 (h), the first gate 101 includes a branch which is electrically connected to the second gate 106 through the second connection via 115 penetrating through the first interlayer insulating layer 110, the first gate insulating layer 107, and the second gate insulating layer 102 on the first gate 101, but the present invention is not limited thereto. Other ways of electrically connecting the first gate 101 and the second gate 106 may be employed. For example, a first gate branch and a second gate branch are led out from the first gate 101 and the second gate 106, respectively, and then the first gate branch and the second gate branch are electrically connected at other positions of the display panel, and a position of the electrical connection between the first gate branch and the second gate branch may be changed according to actual requirements of the display panel.

The source drain metal thin film may be a single-layer or multi-layer composite lamination formed by one or more of molybdenum (Mo), molybdenum-niobium alloy (MoNb), aluminum (Al), aluminum-neodymium alloy (AlNd), titanium (Ti) and copper (Cu); the source drain metal thin film may be made of a composite lamination of molybdenum-niobium alloy and copper.

It should be noted that, a manufacturing method for the thin film transistor in the display substrate may be the same as that for the oxide thin film transistor, and is not described in detail here.

It should be noted that the oxide thin film transistor in this embodiment is a dual-gate oxide thin film transistor, and the oxide thin film transistor may also be a top-gate oxide thin film transistor, a bottom-gate oxide thin film transistor, or the like, and is not limited herein.

In this embodiment, by sequentially forming the oxide semiconductor layer, the second gate insulating layer, and the second gate metal layer on the side of the first gate insulating layer of the oxide thin film transistor distal to the base substrate, and forming the pattern including the second gate and the second gate insulating layer of the oxide thin film transistor, and the active layer of the oxide thin film transistor through patterning processes, since the pattern of the active layer of the oxide thin film transistor is formed after the pattern of the second gate and the second gate insulating layer of the oxide thin film transistor is formed, and since the active layer (for example, IGZO) and the second gate insulating layer are formed by continuous evaporation, a defect state on a channel surface is reduced, which helps to reduce a leakage current of the oxide thin film transistor. Therefore, the channel region of the active layer of the oxide thin film transistor is always in a protected state, ensuring the stability of the channel region of the active layer of the oxide thin film transistor, and further ensuring the driving performance of the display substrate.

In some embodiments, the display substrate may include a 2T1C pixel driving circuit, and the 2T1C pixel driving circuit includes a first thin film transistor and a second thin film transistor. This embodiment will be described by taking an example in which the first thin film transistor is the oxide thin film transistor and the second thin film transistor is the low temperature polycrystalline silicon thin film transistor. The oxide thin film transistor serves as a switching transistor, and the low temperature polycrystalline silicon thin film transistor serves as a driving transistor. It should be noted that the display substrate may include a pixel driving circuit with any other structure, for example, a 7T2C structure, a 6T1C structure, an 8T2C structure, or a 9T2C structure, which is not limited in embodiments of the present disclosure.

It should be noted that the oxide thin film transistor in this embodiment is a dual-gate oxide thin film transistor, the low temperature polycrystalline silicon thin film transistor is a bottom gate transistor, and the oxide thin film transistor and the low temperature polycrystalline silicon thin film transistor may also be other types of thin film transistors, which is not limited in this embodiment.

Figure 3:
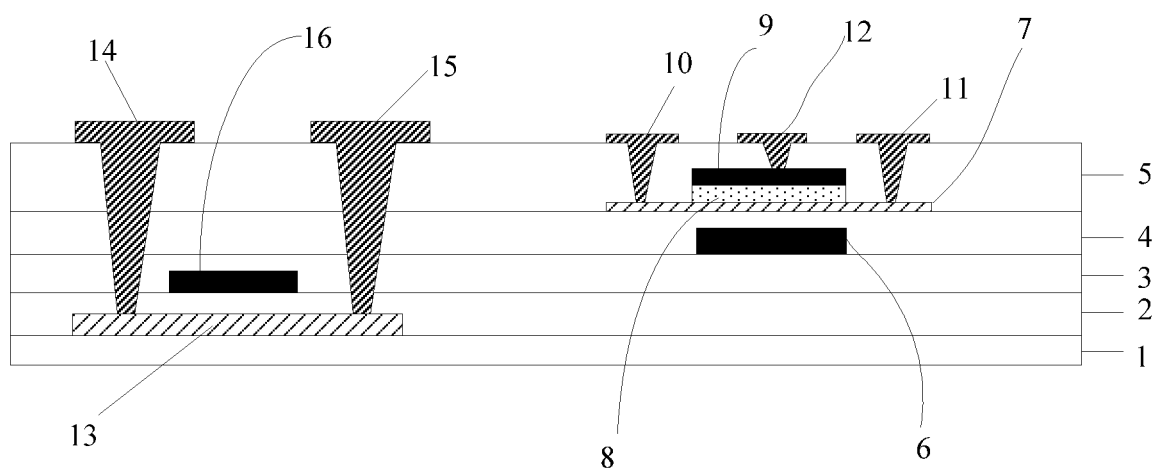
FIG. 3 is a schematic view of a structure of a display substrate according to an embodiment of the present disclosure.
Figure 4:
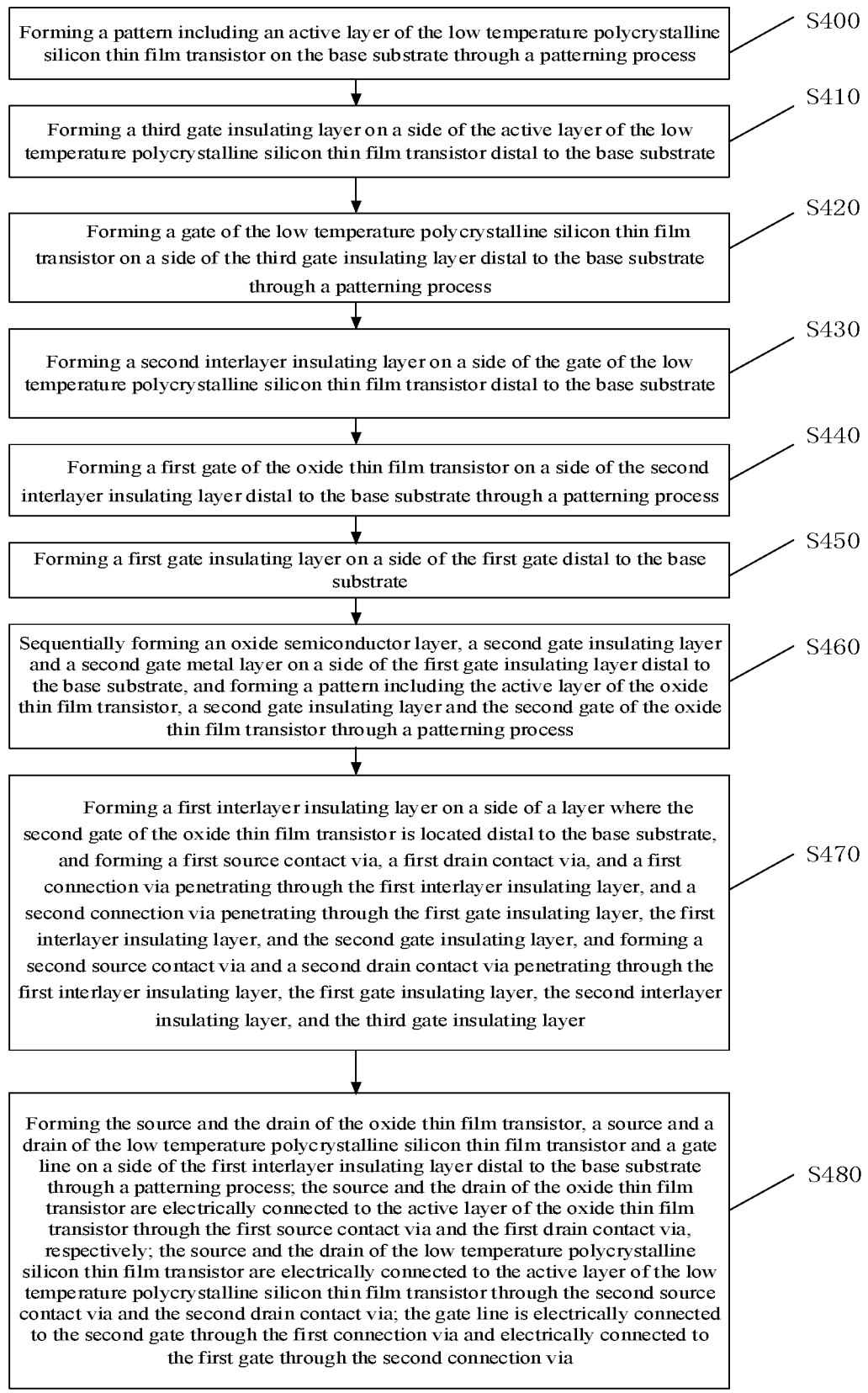
FIG. 4 is a flowchart of a method for manufacturing a display substrate according to an embodiment of the present disclosure.

In this embodiment, the method for manufacturing a display substrate includes a step of forming the pixel driving circuit on the base substrate, wherein the step of forming the pixel driving circuit includes a step of forming the oxide thin film transistor and a step of forming the low temperature polycrystalline silicon thin film transistor. FIG. 3 is a schematic diagram of a structure of a display substrate according to an embodiment of the present disclosure, and as shown in FIG. 4, the steps of forming the oxide thin film transistor on the display substrate and forming the low temperature polycrystalline silicon thin film transistor specifically include steps of:

Step S400, forming a pattern including an active layer 13 of the low temperature polycrystalline silicon thin film transistor on the base substrate 1 through a patterning process.

Step S410, forming a third gate insulating layer 2 on a side of the active layer 13 of the low temperature polycrystalline silicon thin film transistor distal to the base substrate 1.

Step S420, forming a gate 16 of the low temperature polycrystalline silicon thin film transistor on a side of the third gate insulating layer 2 distal to the base substrate 1 through a patterning process.

Step S430, forming a second interlayer insulating layer 3 on a side of the gate 16 of the low temperature polycrystalline silicon thin film transistor distal to the base substrate 1.

Step S440, forming a first gate 6 of the oxide thin film transistor on a side of the second interlayer insulating layer 3 distal to the base substrate 1 through a patterning process.

Step S450, forming a first gate insulating layer 4 on a side of the first gate 6 distal to the base substrate 1.

Step S460, sequentially forming an oxide semiconductor layer, a second gate insulating layer and a second gate metal layer on a side of the first gate insulating layer 4 distal to the base substrate 1, and forming a pattern including an active layer 7, a second gate insulating layer 8 and a second gate 9 of the oxide thin film transistor through a patterning process.

Step S470, forming a first interlayer insulating layer 5 on a side of a layer, where the second gate 9 of the oxide thin film transistor is located, distal to the base substrate 1, and forming a first source contact via, a first drain contact via, and a first connection via penetrating through the first interlayer insulating layer 5, and a second connection via penetrating through the first gate insulating layer, the first interlayer insulating layer, and the second gate insulating layer, and forming a second source contact via, and a second drain contact via penetrating through the first interlayer insulating layer 5, the first gate insulating layer 4, the second interlayer insulating layer 3, and the third gate insulating layer 2.

Step S480, forming a source 10 and a drain 11 of the oxide thin film transistor, a source 14 and a drain 15 of the low temperature polycrystalline silicon thin film transistor and a gate line 12 on a side of the first interlayer insulating layer 5 distal to the base substrate 1 through a patterning process; the source 10 and the drain 11 of the oxide thin film transistor are electrically connected to the active layer 7 of the oxide thin film transistor through the first source contact via and the first drain contact via, respectively; the source 14 and the drain 15 of the low temperature polycrystalline silicon thin film transistor are electrically connected to the active layer 13 of the low temperature polycrystalline silicon thin film transistor through the second source contact via and the second drain contact via, respectively; the gate line 12 is electrically connected to the second gate 9 through the first connection via and electrically connected to the first gate 6 through the second connection via. That is, in this step, the gate line 12 electrically connects the first gate 6 and the second gate 9 together through the first connection via and the second connection via.

It is noted that in this embodiment, the process of forming the active layer, the gate, the source and the drain of the low temperature polycrystalline silicon thin film transistor may be the same as or different from the process of forming the oxide thin film transistor, and is not limited herein. The method of forming the oxide thin film transistor is the same as the process of forming the oxide thin film transistor shown in FIGS. 1(a) to 1(f), and thus, detailed description thereof is omitted.

In this embodiment, by sequentially forming the oxide semiconductor layer, the second gate insulating layer, and the second gate metal layer on the side of the first gate insulating layer of the oxide thin film transistor distal to the base substrate, and forming the pattern including the second gate, the second gate insulating layer pattern, and the active layer of the oxide thin film transistor through a patterning process, since the pattern of the active layer of the oxide thin film transistor is formed after the pattern of the second gate and the second gate insulating layer of the oxide thin film transistor is formed, and since the active layer (for example, IGZO) and the second gate insulating layer are formed by continuous evaporation, a defect state on a channel surface is reduced, which helps to reduce a leakage current of the oxide thin film transistor. Therefore, the channel region of the active layer of the oxide thin film transistor is always in a protected state, ensuring the stability of the channel region of the active layer of the oxide thin film transistor, and further ensuring the driving performance of the display substrate. Further, the source and the drain of the low temperature polycrystalline silicon thin film transistor and the source and the drain of the oxide thin film transistor are formed through one patterning process, so that the number of the processes can be reduced, and the production cost is reduced.

The embodiment of the present disclosure also provides a display substrate, as shown in FIGS. 1(g)-1(h) and 2, the display substrate includes the base substrate 100, and the first thin film transistor disposed on the base substrate 100. The first gate 101 of the first thin film transistor is disposed on the base substrate 100, and the first gate insulating layer 102 is disposed on a side of the first gate 101 of the first thin film transistor distal to the base substrate 100. The active layer 109 of the first thin film transistor is disposed on a side of the first gate insulating layer 102 distal to the base substrate 100. The second gate insulating layer 107 is provided on a side of the active layer 109 of the first thin film transistor distal to the base substrate 100. The second gate 106 of the first thin film transistor is disposed on a side of the first gate insulating layer 106 distal to the base substrate 100, and an orthographic projection of the second gate 107 of the first thin film transistor on the base substrate is located within an orthographic projection of the active layer 109 of the first thin film transistor on the base substrate 100. The first interlayer insulating layer 110 is disposed on a side of the second gate 106 of the first thin film transistor distal to the base substrate 100. The source 111 and the drain 112 of the first thin film transistor, and the gate line 113 are located on a side of the first interlayer insulating layer 110 distal to the base substrate 100, and the source 111 and the drain 112 of the first thin film transistor are connected to the active layer 109 of the first thin film transistor through the source contact via and the drain contact via penetrating through the first interlayer insulating layer 110, respectively, the gate line 113 is electrically connected to the second gate 106 of the first thin film transistor through the first connection via in the first interlayer insulating layer 110, and is electrically connected to the first gate 101 of the first thin film transistor through the second connection via in the first interlayer insulating layer 110, the second gate insulating layer 107, and the first gate insulating layer 102.

In this embodiment, by sequentially forming the second gate and the second gate insulating layer of the first thin film transistor, and the active layer of the first thin film transistor on the side of the first gate insulating layer of the first thin film transistor distal to the base substrate, since the active layer of the first thin film transistor is formed after the pattern of the second gate and the second gate insulating layer of the first thin film transistor is formed, the channel region of the active layer of the first thin film transistor is always in a protected state, ensuring the stability of the channel region of the active layer of the first thin film transistor, and further ensuring the driving performance of the display substrate.

In some embodiments, as shown in FIG. 3, the display substrate further includes a pixel driving circuit disposed on the base substrate 100, and the pixel driving circuit includes the first thin film transistor and a second thin film transistor. The source 14 and the drain 15 of the second thin film transistor are electrically connected to the active layer 13 of the second thin film transistor through the second source contact via and the second drain contact via in the first interlayer insulating layer 5, the first gate insulating layer 4, the second interlayer insulating layer 3, and the third gate insulating layer 2, respectively. The source 14 and the drain 15 of the second thin film transistor are arranged in a same layer as the source 10 and the drain 11 of the first thin film transistor, and are made of a same material.

In this embodiment, by sequentially forming the second gate and the second gate insulating layer of the first thin film transistor, and the active layer of the first thin film transistor on the side of the first gate insulating layer of the first thin film transistor distal to the base substrate, since the active layer of the first thin film transistor is formed after the pattern of the second gate and the second gate insulating layer of the first thin film transistor is formed, the channel region of the active layer of the first thin film transistor is always in a protected state, ensuring the stability of the channel region of the active layer of the first thin film transistor, and further ensuring the driving performance of the display substrate. Further, the source and the drain of the second thin film transistor and the source and the drain of the first thin film transistor are formed through one patterning process, so that the number of the processes can be reduced, and the production cost is reduced.

In some embodiments, a material of the active layer of the first thin film transistor may include amorphous silicon, low temperature polycrystalline silicon, metal oxide, and the like. For example, the material of the active layer of the first thin film transistor of the present disclosure is a metal oxide. That is, the first thin film transistor is a metal oxide thin film transistor.

A third aspect of the present embodiment also provides a display device, which includes the above display substrate. In this embodiment, the display device may be a liquid crystal television, a laptop, a tablet computer, an electronic paper, or the like, for example.

It should be understood that, the above embodiments are merely exemplary embodiments adopted to explain the principles of the present disclosure, and the present disclosure is not limited thereto. It will be apparent to a person skilled in the art that various changes and modifications may be made therein without departing from the spirit and scope of the present disclosure, and these changes and modifications also fall within the scope of the present disclosure.

What is claimed is:

1. A display substrate, comprising a base substrate and a first thin film transistor on the substrate; wherein
   the first thin film transistor comprises a first gate on the base substrate, and a first gate insulating layer on a side of the first gate distal to the base substrate;
   an active layer of the first thin film transistor is on a side of the first gate insulating layer distal to the base substrate; a second gate insulating layer is on a side of the active layer of the first thin film transistor distal to the base substrate;
   a second gate of the first thin film transistor is on a side of the second gate insulating layer distal to the base substrate, and an orthographic projection of the second gate of the first thin film transistor on the base substrate is in an orthographic projection of the active layer of the first thin film transistor on the base substrate; a first interlayer insulating layer is on a side of the second gate of the first thin film transistor distal to the base substrate;
   a source, a drain of the first thin film transistor and a gate line are on a side of the first interlayer insulating layer distal to the base substrate, and the source and the drain of the first thin film transistor are respectively connected to the active layer of the first thin film transistor through a source contact via and a drain contact via penetrating through the first interlayer insulating layer; the gate line is electrically connected to the second gate of the first thin film transistor through a first connection via penetrating through the first interlayer insulating layer; and
   the gate line is electrically connected to the first gate of the first thin film transistor to receive a gate signal through a second connection via penetrating through the first interlayer insulating layer, the second gate insulating layer, and the first gate insulating layer.

2. A display device, comprising the display substrate of claim 1.

3. The display substrate of claim 1, wherein a material of the active layer of the first thin film transistor comprises oxide semiconductor.

4. The display substrate of claim 3, further comprising a low temperature polycrystalline silicon thin film transistor on the base substrate,
   wherein the low temperature polycrystalline silicon thin film transistor comprises a third gate; and
   the third gate, the first gate and the second gate are sequentially arranged in a direction away from the base substrate.

5. The display substrate of claim 1, wherein a depth of the first connection via is smaller than a depth of the source contact via and the drain contact via.

6. The display substrate of claim 5, wherein a depth of the second connection via is larger than the depth of the source contact via and the drain contact via.

7. The display substrate of claim 5, wherein the source contact via, a channel region of the active layer, and the drain contact via are arranged along a first direction;
   the first connection via and the second connection via are arranged along a second direction; and
   the first direction crosses the second direction.

8. The display substrate of claim 7, wherein an area of an orthographic projection of the second gate on the base substrate is smaller than that of the active layer.

9. The display substrate of claim 7, wherein the gate line comprises a first part which is a strip extending along the second direction.

10. A method for manufacturing a display substrate, comprising: a step of forming a first thin film transistor; wherein the step of forming the first thin film transistor comprises steps of:
    forming a first gate of the first thin film transistor on a base substrate through a patterning process;
    forming a first gate insulating layer on a side of the first gate distal to the base substrate;
    sequentially forming a first semiconductor material layer, a second gate insulating material layer and a second gate metal layer on a side of the first gate insulating layer distal to the base substrate, and forming a pattern comprising an active layer of the first thin film transistor and a pattern comprising a second gate insulating layer and a second gate of the first thin film transistor;
    forming a first interlayer insulating layer on a side of a layer, where the second gate of the first thin film transistor is located, distal to the base substrate, and forming a source contact via, a drain contact via and a first connection via penetrating through the first interlayer insulating layer;

forming a source and a drain of the first thin film transistor and a gate line on a side of the first interlayer insulating layer distal to the base substrate; wherein the source and the drain of the first thin film transistor are electrically connected to the active layer through the source contact via and the drain contact via, respectively; and the gate line is electrically connected to the second gate through the first connection via, wherein the method further comprises forming a second connection via penetrating through the first interlayer insulating layer, the second gate insulating layer, and the first gate insulating layer while forming the source contact via, the drain contact via, and the first connection via penetrating through the first interlayer insulating layer; and the gate line is electrically connected to the first gate to receive a gate signal through the second connection via.

11. The method for manufacturing a display substrate of claim 10, wherein the step of sequentially forming a first semiconductor material layer, a second gate insulating material layer and a second gate metal layer on a side of the first gate insulating layer distal to the base substrate, and forming a pattern comprising an active layer of the first thin film transistor and a pattern comprising a second gate insulating layer and a second gate of the first thin film transistor comprises steps of:

sequentially depositing the first semiconductor material layer, the second gate insulating material layer and the second gate metal layer on a side of the first gate insulating layer distal to the base substrate;

forming the pattern comprising the second gate insulating layer and the second gate of the first thin film transistor through a patterning process; and coating photoresist on a side of the second gate of the first thin film transistor distal to the base substrate, and forming the pattern comprising the active layer of the first thin film transistor through a patterning process.

12. The method for manufacturing a display substrate of claim 10, wherein a material of the active layer of the first thin film transistor comprises oxide semiconductor.

13. The method for manufacturing a display substrate of claim 12, further comprising forming a low temperature polycrystalline silicon thin film transistor on the base substrate, wherein the low temperature polycrystalline silicon thin film transistor comprises a third gate; and the third gate, the first gate and the second gate are sequentially arranged in a direction away from the base substrate.

14. The method for manufacturing a display substrate of claim 10, wherein a depth of the first connection via is smaller than a depth of the source contact via and the drain contact via.

15. The method for manufacturing a display substrate of claim 14, wherein a depth of the second connection via is larger than the depth of the source contact via and the drain contact via.

16. The method for manufacturing a display substrate of claim 14, wherein the source contact via, a channel region of the active layer, and the drain contact via are arranged along a first direction;

the first connection via and the second connection via are arranged along a second direction; and the first direction crosses the second direction.

17. The method for manufacturing a display substrate of claim 16, wherein an area of an orthographic projection of the second gate on the base substrate is smaller than that of the active layer.

18. The method for manufacturing a display substrate of claim 16, wherein the gate line comprises a first part which is a strip extending along the second direction.

* * * * *